United States Patent [19]

Takeshita

[11] Patent Number: 5,725,972
[45] Date of Patent: Mar. 10, 1998

[54] MASK WITH GRADUAL INCREASE IN TRANSMITTANCE FROM OPAQUE TO TRANSPARENT REGION

[75] Inventor: Shuji Takeshita, Kawasaki, Japan

[73] Assignee: Fujitsu Limited, Kawasaki, Japan

[21] Appl. No.: 612,163

[22] Filed: Mar. 7, 1996

[30] Foreign Application Priority Data

May 17, 1995 [JP] Japan .................. 7-118792

[51] Int. Cl.⁶ .................. G03F 9/00
[52] U.S. Cl. .................. 430/5; 430/322; 430/324
[58] Field of Search .................. 430/5, 322, 324, 430/22

[56] References Cited

U.S. PATENT DOCUMENTS 5,487,962  1/1996  Rolfson .................. 430/5
5,508,133  4/1996  Bae .................. 430/5
5,523,184  6/1996  Hwang et al. .................. 430/5
5,585,210  12/1996  Lee et al. .................. 430/5

FOREIGN PATENT DOCUMENTS 59-135468  8/1984  Japan .

Primary Examiner—S. Rosasco
Attorney, Agent, or Firm—Staas & Halsey

[57] ABSTRACT

An exposure mask includes a transparent region and an opaque region defined on a transparent substrate, with a transition region formed between he transparent region and the opaque region by a plurality of opaque patterns disposed with respective sizes and respective mutual separations changed gradually and continuously from the opaque region toward the transparent region, such that exposure dose increases gradually and consecutively from the opaque region toward the transparent region.

16 Claims, 14 Drawing Sheets

MASK WITH GRADUAL INCREASE IN TRANSMITTANCE FROM OPAQUE TO TRANSPARENT REGION

BACKGROUND OF THE INVENTION

The present invention generally relates to electric and electronic apparatuses and more particularly to the manufacturing technology of a printed circuit board for use in such electric or electronic apparatuses.

Printed circuit boards are used commonly in electric and electronic apparatuses for carrying various components as well as interconnection patterns connecting the components.

In relation to the ever increasing tendency of mounting density of components on a printed circuit board, recent printed circuit boards are increasingly formed of an electroplating process, rather than conventional screen printing process, such that the conductor patterns are deposited from an electrolyte solution while using a photoresist mask patterned according to the conductor pattern to be formed on the printed circuit board. In the description hereinafter, such circuit boards in which the conductor patterns are formed by an electroplating process rather than screen printing process, is also referred to as a "printed circuit board," according to the conventional practice.

In order to form such a photoresist mask, an exposure mask is employed for patterning an optical beam used for the exposure of the photoresist mask.

FIGS. 1A and 1B show a part of such an exposure mask 11, wherein FIG. 1A shows the exposure mask 11 in a plan view while FIG. 1B shows the exposure mask 11 in a cross sectional view.

Referring to FIGS. 1A and 1B, the exposure mask 11 includes a transparent region 12 for passing the optical beam at the time of exposure and an opaque region 13 that interrupts the optical beam. For example, the exposure mask 11 may be formed on a glass substrate 11 as indicated in FIG. 1B, wherein it will be noted that the opaque region 13 is formed of a metal pattern 15 such as Cr. Thereby, the metal pattern 15 completely interrupts the incident optical beam, and consequently, the optical transmittance of the pattern 15 is 0%. On the other hand, the region outside the metal pattern 15 corresponds to the transparent region 12 where the optical transmittance is nearly 100%.

Using the exposure mask 11, a printed circuit board is manufactured according to a process shown in FIGS.2A–2F.

Referring to FIG. 2A, an optical irradiation process is conducted upon a substrate 16 that carries thereon a photosensitive layer 17a, while using the exposure mask 11. As already explained, the exposure mask 11 includes the opaque region 13 and the transparent region 12. Thereby, the photosensitive layer 17a is selectively exposed at the region corresponding to the transparent region 12 of the exposure mask, and a resist pattern 17 is obtained as an insulator pattern formed on the substrate 16 as indicated in FIG. 2B, after a developing process that follows the exposure process of FIG. 2A. In the step of FIG. 2B, a baking process is applied upon the resist pattern 17 to convert the same to a stable insulation pattern. Because of the sharp transition of the transmittance of the exposure mask 11 at the boundary between the opaque region 13 and the transparent region 12, the insulation pattern 17 thus formed is defined by a vertical side wall forming a substantially right angle Θ with respect to a top, major surface thereof.

Next, in the step of FIG. 2C, a thin conductor layer 18 is deposited by a sputtering process and the like, so as to cover the exposed surface of the substrate 16 as well as the side wall and the top surface of the insulation pattern 17.

Further, in the step of FIG. 2D, a resist layer 19 is deposited on the structure of FIG. 2C, followed by a patterning process to form an aperture 20 according to the conductor pattern to be formed on the insulation pattern 17, and an electroplating process is conducted in the step of FIG. 2E while using the conductor layer 18 as an electrode. Thereby, a thick conductor pattern 21a is grown on the insulation pattern 17 selectively in correspondence to the aperture 20.

After the conductor pattern 21a is thus formed, the resist pattern 19 is removed by dissolving into an organic solvent, followed by an ion milling process for removing the extraneous conductor layer 18, and the structure shown in FIG. 2F is obtained where the conductor pattern 21 is formed on the insulation pattern 17 converted from photoresist.

In the conventional process of FIGS. 2A–2F, it should be noted that any cracks associated with mechanical processes such as dicing or sawing applied against the exposed part of the substrate 16, do not propagate to the insulation pattern 17, and the problems associated with such crack propagation is successfully eliminated.

As already noted, the conventional process explained before includes a baking process in the step of FIG. 2B for converting the photoresist pattern 17 into a stable insulation pattern, wherein such a baking process is conducted at a high temperature, typically over 1200° C. for conventional photoresists or over 400° C. for photo-definable polyimides. Associated with such a baking process, the resist pattern 17 tends to shrink as indicated in FIG. 3A and induce a cracking in the substrate 16. When the adherence of the resist pattern 17 upon the substrate 16 is not firm, on the other hand, such a shrinkage of the resist pattern 17 may inducing a coming-off of the pattern 17 from the substrate 16.

Further, the conventional process of FIGS. 2A–2F has a drawback, due to the sharp edge angle Θ, in that the coverage of the photoresist layer 19 over the insulation pattern 17 may become incomplete at the edge of the pattern 17 as indicated in FIG. 4A. In FIG. 4A, it will be noted that the conductor layer 18 is exposed at the edge of the pattern 17.

When the electroplating process is conducted in such a state, it will be noted that the deposition occurs not only at the aperture 20 but also on the exposed edge part of the pattern 17 as indicated in FIG. 4B. In FIG. 4B, it will be noted that a spherical deposit 21a' of conductor is formed simultaneously to the conductor pattern 21a, wherein such a spherical deposit 21a' remains even after the resist layer 19 and the underlying conductor layer 18 is removed. Such an extraneous conductor 21a' causes various problems such as short circuit in the apparatus that uses the printed circuit board.

SUMMARY OF THE INVENTION

Accordingly, it is a general object of the present invention to provide a novel and useful process for manufacturing a printed circuit board and an exposure mask used in such a process wherein the foregoing problems are eliminated.

Another object of the present invention is to provide a method for manufacturing a printed circuit board with insulation patterns having a gradually thinning edge.

Another object of the present invention is to provide an exposure mask comprising:

a mask substrate;

a transparent region defined on said mask substrate;

an opaque region defined on said mask substrate; and a transition region defined on said mask substrate between said transparent region and said opaque region;

said transition region comprising a plurality of opaque patterns having respective sizes and disposed with respective mutual separations, such that said transmission region increases a transmittance gradually from said opaque region to said transparent region.

Another object of the present invention is to provide a method for manufacturing a printed circuit board carrying a conductor pattern on a substrate, comprising the steps of:

depositing a photoresist layer upon said substrate;

exposing said photoresist layer by using an exposure mask, said exposure mask including a mask substrate, a transparent region defined on said mask substrate, an opaque region defined on said mask substrate, and a transition region defined on said mask substrate between said transparent region and said opaque region, said transition region comprising a plurality of opaque patterns having respective sizes and disposed with respective mutual separations, such that said transmission region increases a transmittance gradually from said opaque region to said transparent region;

developing said exposed photoresist layer to form a resist pattern; and converting said resist pattern into an insulation pattern by conducting a baking process.

Another object of the present invention is to provide a printed circuit board, comprising:

a substrate; and a pattern formed on said substrate;

said pattern being defined by a sloped pattern boundary such that said pattern reduces a thickness gradually and consecutively from an interior of said pattern toward an exterior of said pattern.

Another object of the present invention is to provide a printed circuit board, comprising:

a substrate;

a pattern formed on said substrate; and a via hole provided on said pattern;

said via hole being defined by an inclined side wall such that said pattern decreases a thickness thereof from a marginal region of said via hole toward a central part of said via hole, gradually and consecutively.

According to the present invention, the resist pattern formed as a result of exposure and development of the photoresist layer has a thickness that changes gradually, on the substrate, from a region corresponding to the transparent region of the mask to a region corresponding to the opaque region of the mask. Thereby, the resist pattern and hence the insulation pattern thus formed on the substrate is defined by a gradually thinning edge, and the problems such as cracking of the substrate at the time of baking process or deposition of extraneous conductors on an exposed edge of the pattern at the time of electroplating process, are successfully eliminated. Further, the printed circuit board thus formed according to the present invention can be subjected to a mechanical dicing process without inviting propagation of cracks into the insulation pattern from the dicing region. Further, it is possible to form a via hole in a printed circuit board defined by a sloped side wall. Thereby, the problems associated with the sharp edge of the via hole are successfully eliminated.

Other objects and further features of the present invention will become apparent from the following detailed description when read in conjunction with the attached drawings.

DETAILED DESCRIPTION OF THE PREFERRED EMBODIMENTS

Figure 5A:
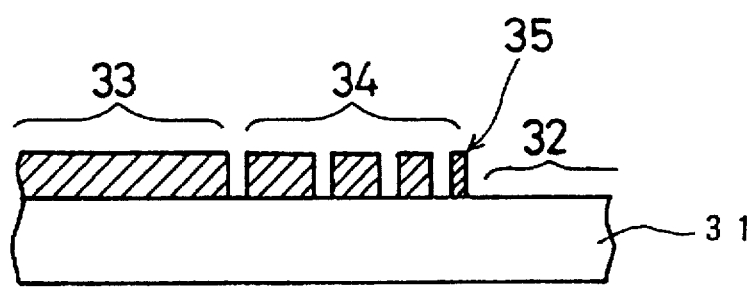
FIGS. 5A and 5B are diagrams showing the principle of the present invention.
Figure 5B:
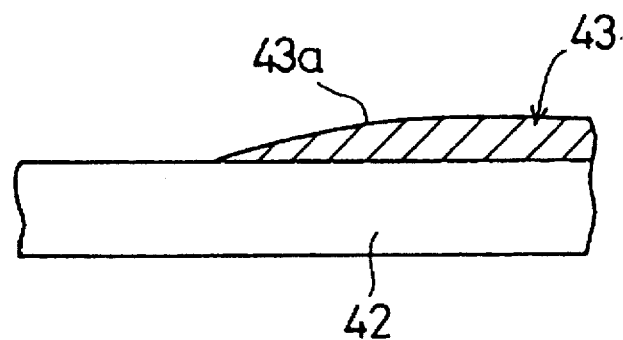

FIGS. 5A and 5B show the principle of the present invention for manufacturing a printed circuit board.

Referring to FIG. 5A, the present invention uses a mask 30 that includes a mask substrate 31, wherein a transparent region 32 is defined on the mask substrate 31 adjacent to an opaque region 33 also defined on the mask substrate 31, for example by a metal pattern. In the present invention, a transition region 34 is further defined on between the transparent region 32 and the opaque region 33, such that the transition region gradually increases a transmittance from the opaque region to the transparent region.

Figure 1A:
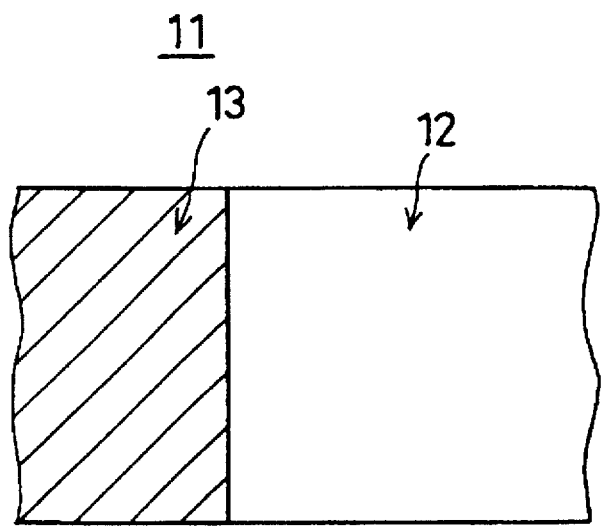
FIGS. 1A and 1B are diagrams showing the construction of a conventional exposure mask used in the manufacturing of a printed circuit board.
Figure 1B:
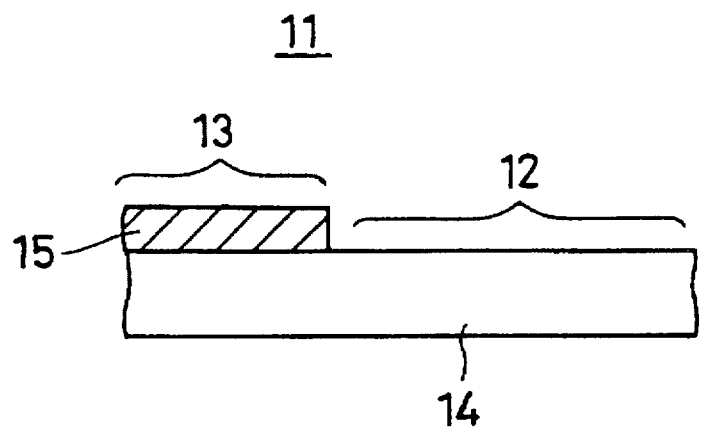
Figure 2A:
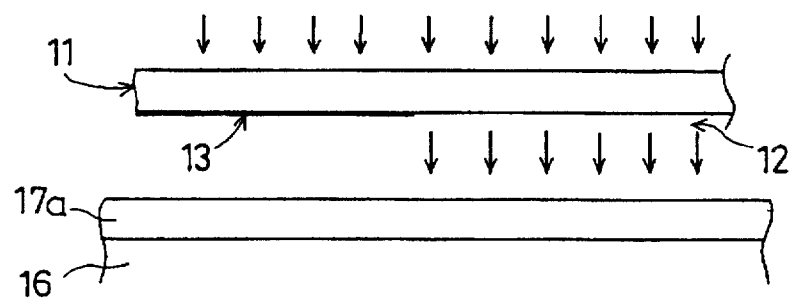
FIGS. 2A–2F are diagrams showing a conventional process for manufacturing a printed circuit board.
Figure 2B:
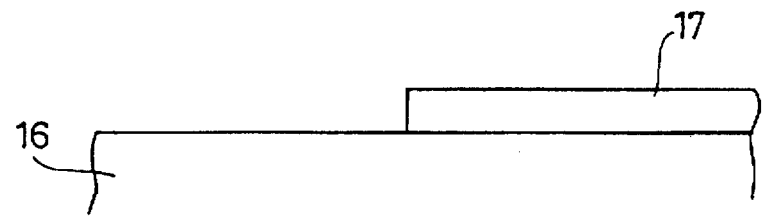
Figure 2C:
Figure 2D:
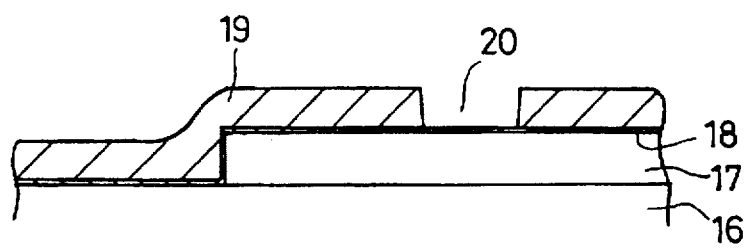
Figure 2E:
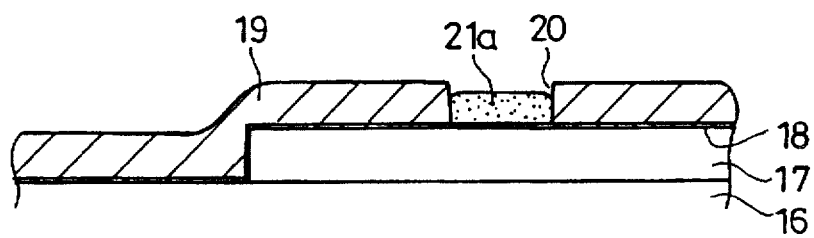
Figure 2F:
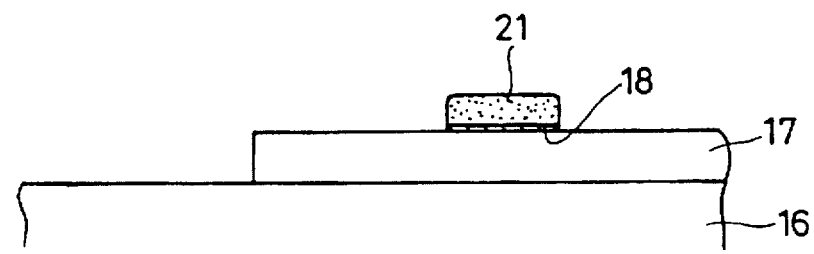
Figure 3A:
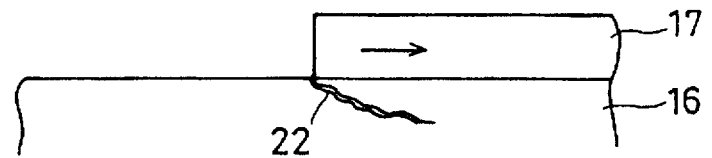
FIGS. 3A and 3B are diagrams showing a problem of the conventional process associated with the use of the exposure mask of FIGS. 1A and 1B.
Figure 3B:

By conducting an exposure process of a photoresist layer corresponding to the resist layer 17a of FIG. 2A by means of the exposure mask 30, one obtains a structure indicated in FIG. 5B, in which an insulation pattern 43, formed on a substrate 42, is defined by a sloped edge 43a. In FIG. 5B, it should be noted that the substrate 42 corresponds to the substrate 16 of FIG. 2B, and the insulation pattern 43 corresponds to the insulation pattern 17, which has been converted from a resist pattern by the baking process.

By forming the insulation pattern 43 to have the sloped edge 43a as such, it is possible to avoid the problem of concentration of stress in the vicinity of the edge 43a at the time of the baking process, and the problem of cracking of the substrate 42 or coming-off of the insulation pattern 43 from the substrate 42 due to the accumulated stress at the pattern edge 43a, is successfully eliminated. Further, because of the blunt shape of the edge 43a, the problem explained with reference to FIGS. 4A–4C does not take place.

Figure 6A:
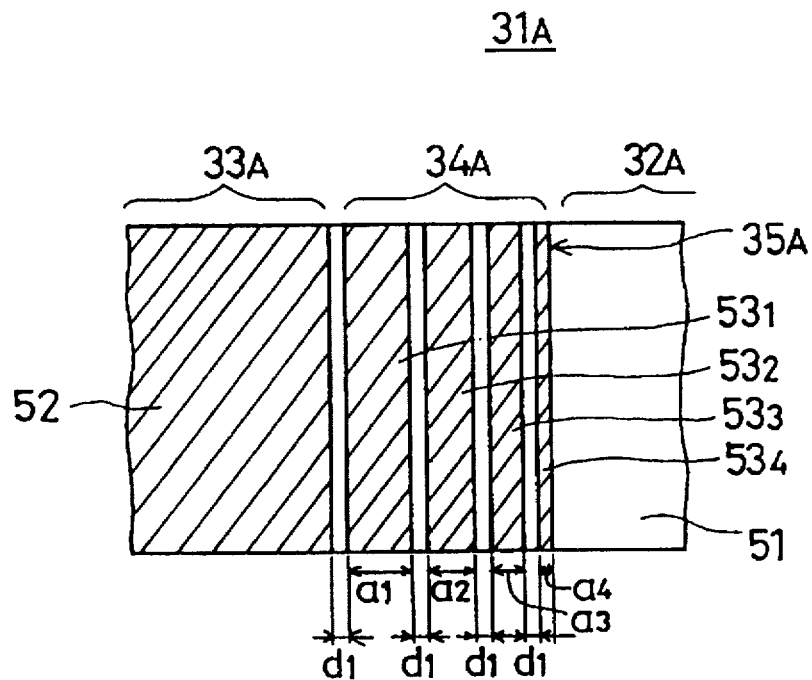
FIGS. 6A and 6B are diagrams showing the construction of an exposure mask used in a first embodiment of the present invention.
Figure 6B:
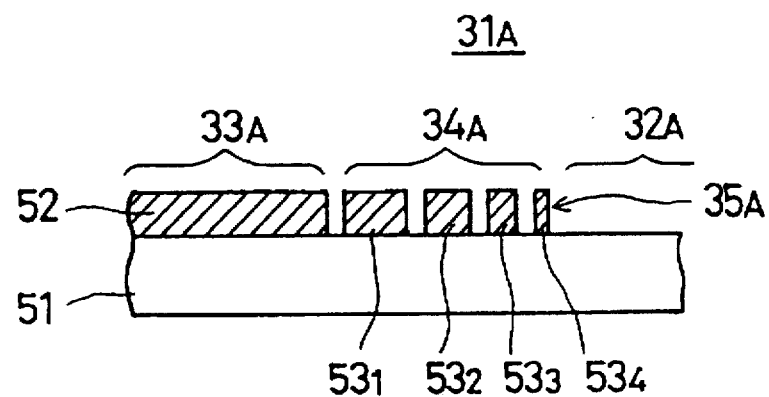

Next, a first embodiment of the present invention will be described with reference to FIGS. 6A and 6B, wherein FIG. 6A shows an exposure mask 31A in a plan view while FIG. 6B shows the same exposure mask 31A in a cross sectional view.

Referring to FIGS. 6A and 6B, the exposure mask includes a substrate 51 of a glass slab on which an opaque membrane 52 is provided as an opaque region 33A.

Adjacent to the opaque region 33A, there is defined a transition region 34A formed of a number of opaque stripes $53_1$–$53_4$ disposed with a uniform separation $d_1$ and with respective, consecutively decreasing widths $a_1$, $a_2$, $a_3$ and $a_4$ ($a_1 > a_2 > a_3 > a_4$). Typically, the separation $d_1$ is set to 2 µm, well below the resolution limit of the optical system used for the exposure, while the widths $a_1$, $a_2$, $a_3$ and $a_4$ may be set to 8 µm, 6 µm, 4 µm and 2 µm, respectively.

Outside the transition region 34A, a transparent region 32A is defined as a region free from any opaque patterns. Thus, the transparent region 32A has a 100% transmittance and transmits an incoming optical beam without interruption.

By providing the transition region 34A in the exposure mask 31A between the opaque region 33A and the transparent region 32A, it is possible to change the exposure dose gradually from a region of the exposed photoresist layer corresponding to the opaque region 33A to a region corresponding to the transparent region 32A.

FIGS. 7A–7D show the process for manufacturing a printed circuit board by using the exposure mask 31A of FIGS. 6A and 6B.

Figure 7A:
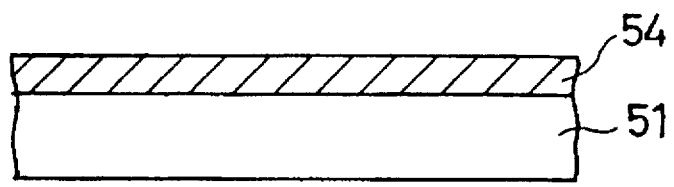
FIGS. 7A–7D are diagrams showing the process for fabricating the exposure mask of the first embodiment.

Referring to FIG. 7A, a metal film 54 such as Cr is deposited upon a glass substrate 51 by a sputtering process and the like. One may also use a photosensitive material such as silver salt ($AgNO_3$) for the film 54.

Figure 7B:
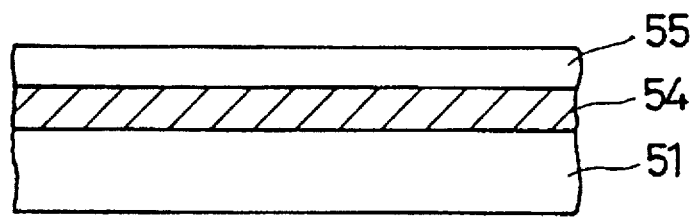
Figure 7C:
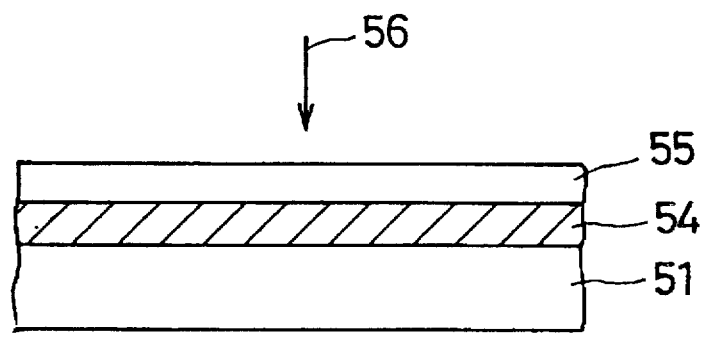

Next, in the step of FIG. 7B, a photoresist layer 55 is deposited on the foregoing metal film 54, and the resist layer 55 is subjected to an electron beam exposure process in the step of FIG. 7C, wherein the step of FIG. 7C includes a scanning of an electron beam 56 over the photoresist layer 55 according to the mask pattern to be formed on the substrate 51.

Figure 7D:
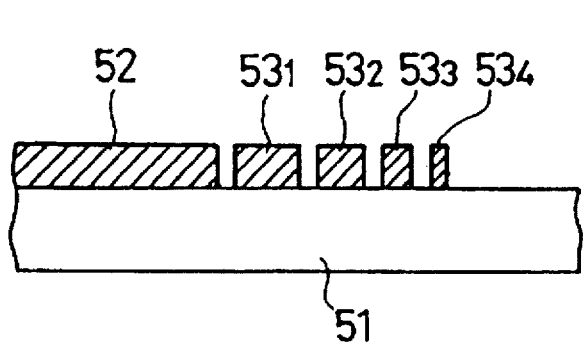

After developing the resist to form a resist mask, the metal film 54 is patterned according to the resist mask. After removing the resist mask, one obtains the exposure mask 31A as indicated in FIG. 7D. By using the electron beam exposure process in the step of FIG. 7C, it is possible to expose the resist layer 55 as desired by changing the shape of the electron beam or by changing the scheme of scanning of the electron beam such as the density of scanning.

FIGS. 8A–8E show the process of manufacturing a printed circuit board that includes the exposure step conducted by using the exposure mask 31A.

Figure 8A:
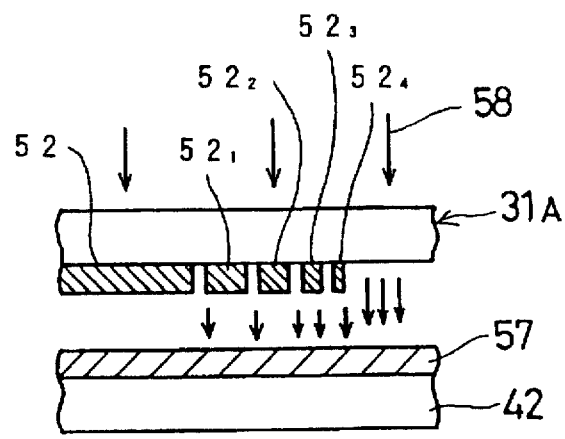
FIGS. 8A–8E are diagrams showing the process of manufacturing a printed circuit board according to the first embodiment of the present invention.

Referring to FIG. 8A, the exposure mask 31A is placed above a substrate 42 on which the conductor pattern is to be formed. In the step of FIG. 8A, it will be noted that the substrate 42 carries, on an upper major surface thereof, a resist layer 57 to be exposed by an optical beam 58 that is shaped by the exposure mask 31A. The resist layer 57 may be a photosensitive polyimide or other suitable photosensitive insulator and may be deposited with a thickness of about 8 µm.

As the exposure mask 31A carries the opaque membrane 52 as well as the opaque patterns $53_1$–$53_4$ with consecutively decreasing widths as already explained, the exposure dose supplied to the photoresist layer 57 increases gradually from the region corresponding to the opaque membrane 52 toward the region corresponding to the opaque pattern $53_4$.

Figure 8B:
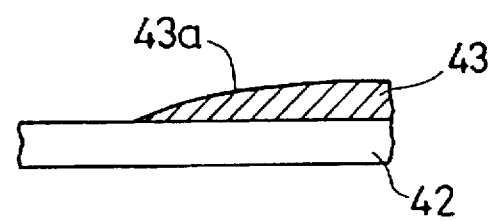

After the exposure in the step of FIG. 8A, the photoresist layer 57 is developed as usual, and a baking process is conducted for converting the same to the stable insulation pattern 43 as indicated in FIG. 8B. The baking process may be conducted at 130° C. for 30 minutes in the case of positive photoresist or 400° C. for 1 hour in the case of photosensitive polyimide. As the exposure dose changes gradually at the boundary part of the opaque membrane 52, the insulation pattern 43 has a structure indicated in FIG. 8B, wherein the insulation pattern 43 is characterized by the slope 43a at the edge part thereof such that the thickness of the pattern 43 changes gradually and consecutively.

Figure 8C:
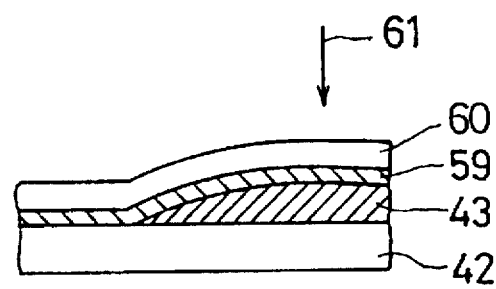

After the insulation pattern 43 is thus formed, a step of FIG. 8C is conducted in which a thin conductive layer 59 is deposited on the entire surface of the structure of FIG. 8C by a sputtering process, followed by a deposition of another photoresist layer 60 as indicated in FIG. 8C. The photoresist layer 60, in turn, is subjected to an exposure process according to the conductor pattern to be formed on the insulation pattern 43.

Figure 8D:
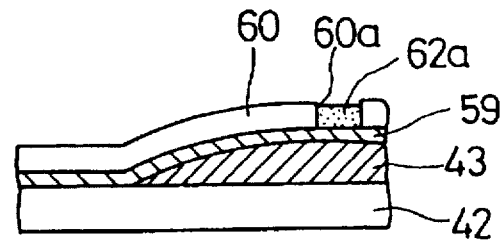

As a result of the exposure of the photoresist layer 60, an aperture 60a is formed on the photoresist layer 60 according to the conductor pattern to be formed, such that the aperture 60a exposes the conductor layer 59 as indicated in FIG. 8D. Further, by implementing an electroplating process while using the conductor layer 59 as an electrode, a conductor pattern 62a grows from an electrolyte solution on the exposed surface of the conductor layer 59 in correspondence to the aperture 60a, such that the conductor pattern 62a fills the aperture 60a.

Figure 8E:
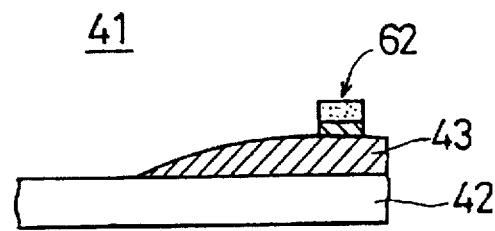

Finally, in the step of FIG. 8E, the resist layer 60 is removed by dissolving into a solvent. After removing further the exposed conductor layer 59 by an ion milling process, one obtains a printed circuit board as indicated in FIG. 8E wherein the insulation pattern 43 carries thereon a conductor pattern 62.

By using the mask 31A that realizes a gradually increasing exposure dose at the edge part of the opaque membrane 52 thereon, the sharp edge is eliminated from the side wall of the insulation pattern 43, and the problems explained with reference to FIGS. 3A and 3B or FIGS. 4A–4C are successfully eliminated.

Figure 9:
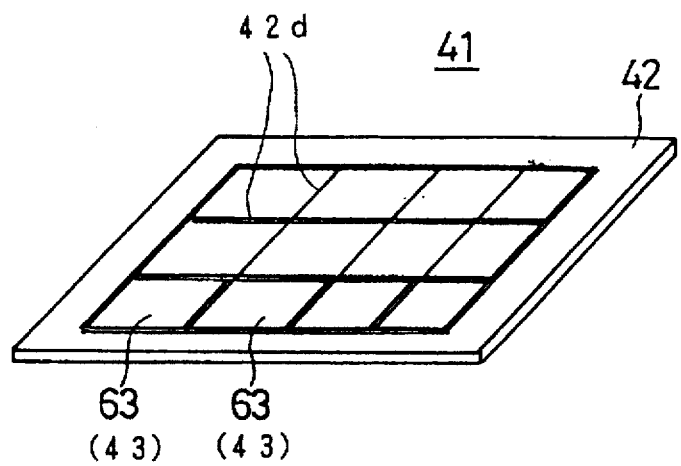
FIG. 9 is a diagram showing the printed circuit board formed by using the exposure mask of the first embodiment, in a perspective view.

FIG. 9 shows the overall perspective view of the printed circuit board formed by the process of the present embodiment.

Referring to FIG. 9, it will be noted that the substrate 42 carries thereon the insulation pattern 43 with plural numbers, with an intervening dicing region 42d formed such that the dicing region 42d exposes the surface of the substrate 42. In correspondence to each of the insulation patterns 43, a thin film circuit 63 is formed.

In such a construction, it should be noted that fracture or coming off of the insulation pattern 43 does not occur even when the substrate 42 is subjected to a mechanical dicing process along the dicing region 42d, as the accumulation of stress at the edge part of the insulation pattern 43 is substantially reduced by gradually decreasing the thickness of the pattern 43 at the slope 43a.

Figure 10A:
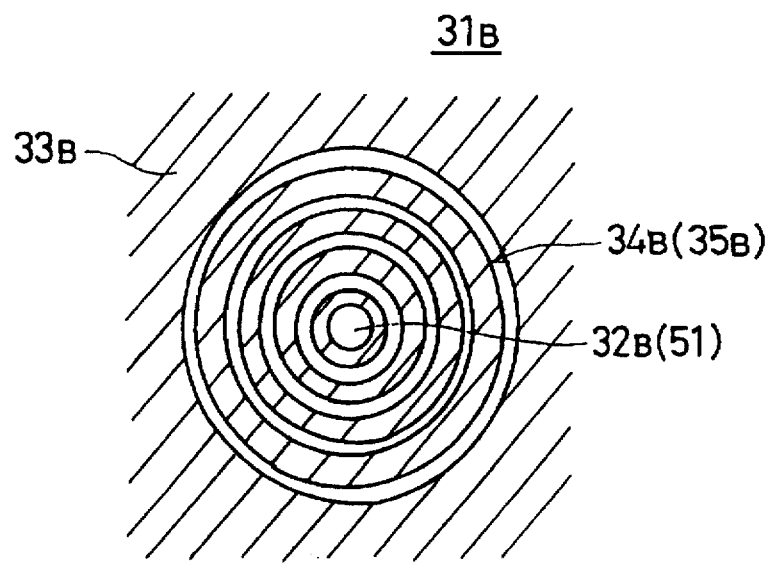
FIGS. 10A and 10B are diagrams showing a modification of the exposure mask of the first embodiment.
Figure 10B:
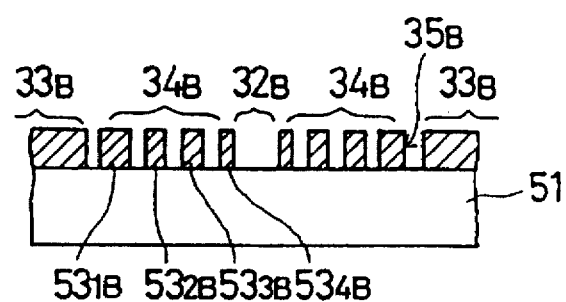

FIGS. 10A and 10B show a modification of the exposure mask of the present embodiment.

Referring to FIGS. 10A and 10B, an exposure mask 31B is formed also on the substrate 51 of a glass slab, wherein the mask 31B carries thereon a number of concentric patterns or bands $53_{1B}, 53_{2B}, 53_{3B}$ and $53_{4B}$ of an opaque material, such that the patterns $53_{1B}, 53_{2B}, 53_{3B}$ and $53_{4B}$ fit in a circular cutout formed in an opaque pattern 33B covering the surface of the substrate 51. Thereby, the innermost band $53_{4B}$ defines a transparent region 32B, and the patterns $53_{1B}$, $53_{2B}, 53_{3B}$ and $53_{4B}$ collectively form a transition region 34B.

As will be seen in FIGS. 10A and 10B, the bands $53_{1B}$, $53_{2B}, 53_{3B}$ and $53_{4B}$ are disposed with a constant, predetermined separation such as 2 μm, while the width of the band decreases gradually from the outer band to the inner band. For example, the band $53_{1B}$ has a width of 8 μm, the band $53_{2B}$ has a width of 6 μm, the band $53_{3B}$ has a width of 4 μm and the band $53_{4B}$ has a width of 2 μm. Thereby, it is possible to increase the exposure dose gradually from the rim of the opaque pattern 33B toward the center where the transparent region 32B is formed.

The exposure mask 31B of FIGS. 10A and 10B is useful for exposing a contact hole in a multi-layer printed circuit board.

Figure 11:
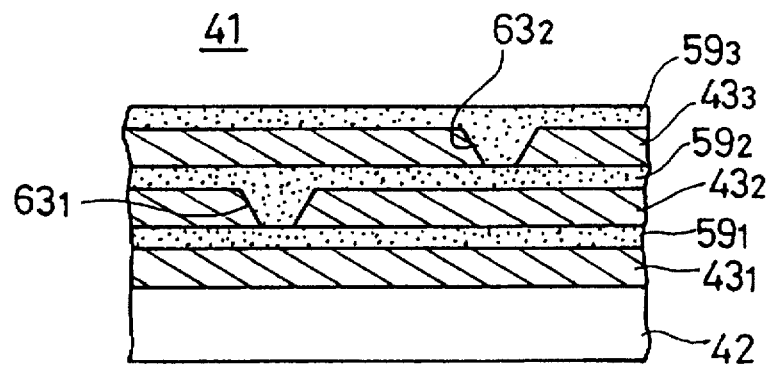
FIG. 11 is a diagram showing the construction of a printed circuit board formed by using the exposure mask of FIGS. 10A and 10B in a cross sectional view.

FIG. 11 shows an example of such a multi-layer printed circuit board 41 that includes contact holes formed by an exposure process that uses the exposure mask 31B of FIGS. 10A and 10B.

Referring to FIG. 11, the printed circuit board 41 includes a substrate 42 carrying thereon an insulation layer $43_1$ formed with a thickness of 8 μm, on which a conductor layer $59_1$ is formed with a thickness of 3 μm. Further, another insulation layer $43_2$ is provided on the conductor layer $59_1$, wherein the insulation layer $43_2$ is formed with a contact hole $63_1$ with a predetermined resolution such as 4 μm. Thereby, the conductor layer $59_1$ and the conductor layer $59_2$ are connected with each other across the insulation layer $43_2$.

It will be noted that a similar insulation layer $43_3$ is formed on the conductor layer $59_2$, wherein the insulation layer $43_3$ is formed with a contact hole $63_2$ by an exposure process that uses the exposure mask 31B. As a result, an electrical connection is achieved between a conductor layer $59_3$ formed on the insulation layer $43_3$ and the conductor layer $59_2$.

Thus, the printed circuit board 41 has a multiple layer structure including a plurality of conductor layers connected with each other by contact holes formed in the insulation layers. By using the exposure mask 31B indicated in FIGS. 10A and 10B, it is possible to form the contact holes $63_1$ and $63_2$ with an inclined side wall that eliminates any sharp edges from the insulation layers $43_2$ and $43_3$. Thus, it is possible to eliminate the problem of the conductor layer $59_2$ or $59_3$ being disconnected due to the defects associated with such a sharp edge of the contact holes.

The exposure mask 31B can be fabricated similarly to the exposure mask 31A explained before. Further, the fabrication process of the exposure mask 31A is applicable also to the exposure masks of other embodiments to be described later.

It is noted that the Japanese Laid-open Patent Publication 59-135468 describes a fabrication of an exposure mask that exposes a contact hole defined by an inclined side wall that includes a number of steps on the side wall. The exposure mask of the foregoing prior art includes a number of metal films with different thicknesses such that the opaque pattern formed of the metal films changes the thickness stepwise. Thereby, the prior art exposure mask changes the optical dose stepwise at the edge part of the exposure pattern.

It is noted that such a conventional exposure mask has to be fabricated with an exact control of the thickness of the metal patterns formed on the mask substrate, while such a high precision control of thickness is difficult to achieve in the sputtering process or evaporation deposition process. Further, such a conventional process has a drawback, due to the fact that the contact hole is defined by a stepped side wall, that the coverage of the photosensitive layer upon such a stepped side wall may become incomplete similarly to the case explained with reference to FIGS. 4A–4C.

Figure 4A:
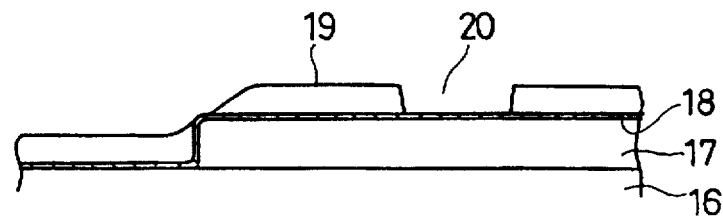
FIGS. 4A–4C are diagrams showing another problem of the conventional process associated with the use of the exposure mask of FIGS. 1A and 1B.
Figure 4B:
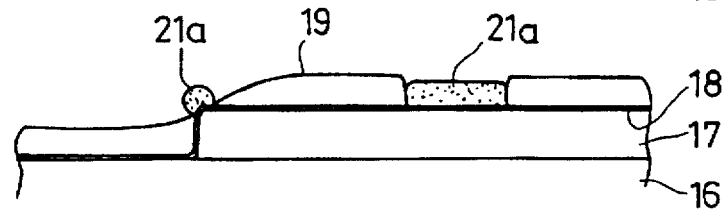
Figure 4C:
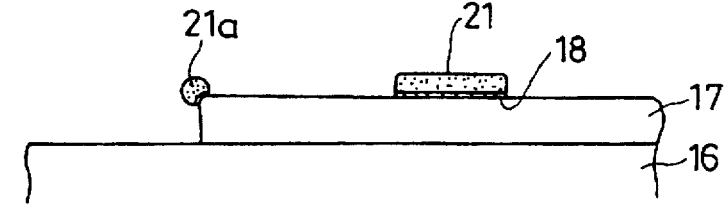

In contrast, the present invention has a distinctive advantage over the prior art in the point that the exposure mask 31A or 31B includes the opaque patterns $53_1$–$53_4$ formed with a uniform, constant thickness. Thereby, the fabrication process of the exposure mask is substantially simplified, and the cost of the mask and hence the printed circuit board obtained by using such a mask is reduced. Further, the problem of incomplete coverage of the pattern edge by a photoresist layer as explained with reference to FIGS. 4A–4C is eliminated.

Figure 12A:
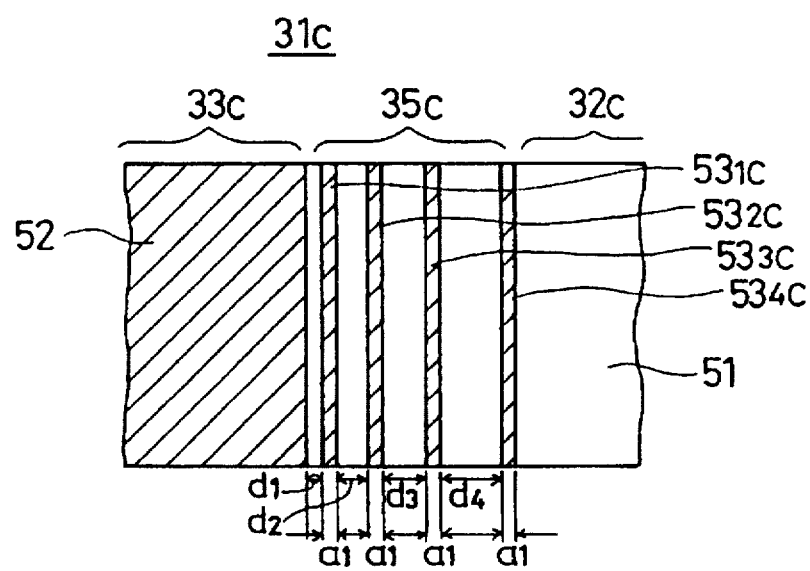
FIGS. 12A and 12B are diagrams showing the construction of an exposure mask according to a second embodiment of the present invention.
Figure 12B:
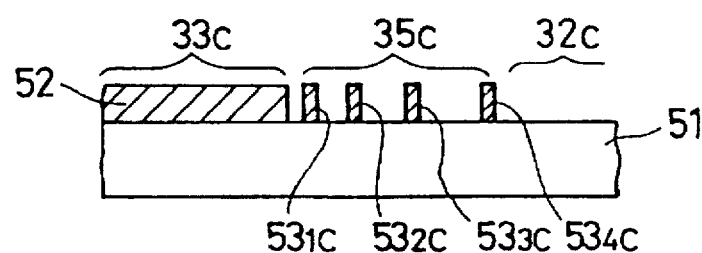

FIGS. 12A and 12B show an exposure mask 31C according to a second embodiment of the present invention, wherein FIG. 12A shows the exposure mask in a plan view while FIG. 12B shows the exposure mask in a cross sectional view. In FIGS. 12A and 12B, those parts corresponding to the parts described previously are designated by the same reference numerals and the description thereof will be omitted.

Referring to FIGS. 12A and 12B, the exposure mask 31C is formed on the substrate 51 of a glass slab on which a transparent region 32C and an opaque region 33C are defined, wherein the opaque region 33C is covered by the opaque membrane 52 similarly as before. Further, at the boundary part between the opaque region 33C and the transparent region 32C, a transition zone 35C is formed as a region including a number of opaque patterns $53_{1C}$–$53_{4C}$, wherein the opaque patterns $53_{1C}$–$53_{4C}$ have a common width $a_1$ typically set to 2 μm but are disposed with various separations $d_1$–$d_4$ such that the separation increases with increasing distance from the edge of the opaque membrane 52 toward the transparent region 51 ($d_1 < d_2 < d_3 < d_4$). Typically, the separations $d_1$–$d_4$ are set such that $d_1=2$ μm, $d_2=4$ μm, $d_3=6$ μm and $d_4=8$ μm. It should be noted that the foregoing width $a_1$ of the patterns $53_{1C}$–$53_{4C}$ is set smaller than the resolution limit of the exposure of 4 μm.

By using the exposure mask 31C, it is possible to expose a pattern to have a sloped edge similarly as explained before with reference to FIGS. 8A–8E.

Figure 13:
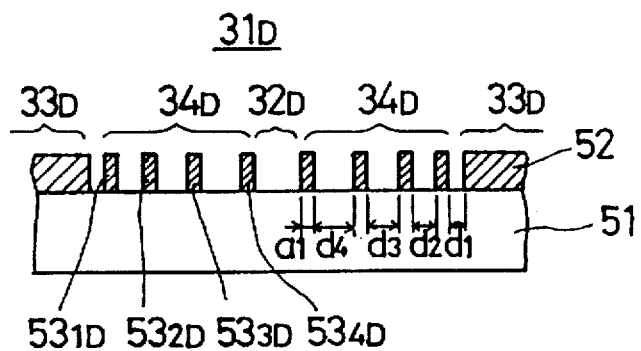
FIG. 13 is a diagram showing a modification of the exposure mask of the second embodiment.

FIG. 13 shows an exposure mask 31D according to a modification of the exposure mask 31C, wherein those parts corresponding to the parts described previously are designated by the same reference numerals and the description thereof will be omitted.

Referring to FIG. 13, the exposure mask 31D is formed on the substrate 51 of a glass slab on which the opaque membrane 52 is formed as an opaque region 33D, wherein the opaque membrane 52 is formed with a circular cutout exposing the substrate 51, and a transparent region 32D is defined at the central part of the circular cutout. Further, between the rim of the circular cutout and the transparent region 32D at the central part thereof, a number of concentric opaque bands $53_{1D}$–$53_{4D}$ are formed as the transition zone 35C. Thus, the exposure mask 31D has a plan view somewhat similar to the plan view of the mask 31B shown in FIG. 10A, except that the width $a_1$ of the bands is now fixed at 2 μm and the separations $d_1$–$d_4$ increase gradually and consecutively from the rim of the circular cutout toward the transparent region 32D at the center of the circular cutout ($d_1<d_2<d_3<d_4$). Typically, the separations $d_1$–$d_4$ are set such that—$d_1$=2 μm, $d_2$=4 μm, $d_3$=6 μm and $d_4$=8 μm.

By using the exposure mask 31D, too, it is possible to form a contact hole defined by a sloped side wall similarly to the case of FIG. 11.

Figure 14A:
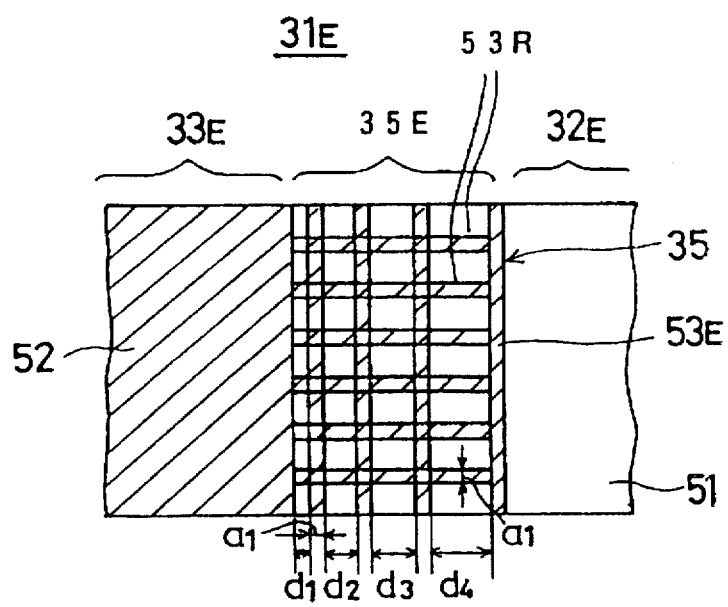
FIGS. 14A and 14B are diagrams showing the construction of an exposure mask according to a third embodiment of the present invention.
Figure 14B:
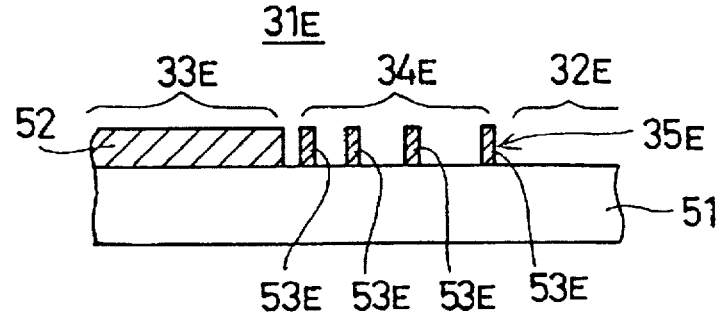

FIGS. 14A and 14B show an exposure mask 31E according to a third embodiment of the present invention, wherein FIG. 14A shows the mask 31E in a plan view while FIG. 14B shows the mask in a cross sectional view. In FIGS. 14A and 14B, those parts corresponding to the parts described previously are designated by the same reference numerals and the description thereof will be omitted.

Referring to FIGS. 14A and 14B, the exposure mask 31E is formed on the substrate 51 of a glass slab that carries thereon the opaque membrane 52 acting as an opaque region 33E. The substrate 51 is further defined with a transparent region 32E, and a transition zone 35E is formed between the opaque region 33E and the transparent region 32E.

It should be noted that the transition zone 35E includes a mesh pattern of an opaque material formed of a plurality of column grids 53E and a plurality of row grids 53R, wherein the column grids 53E have a width $a_1$ typically set to 2 μm and disposed with consecutively and gradually increasing mutual separations $d_1$–$d_4$ from the edge of the opaque region 33E toward the transparent region 32E ($d_1<d_2<d_3<d_4$). Typically, the separations $d_1$–$d_4$ are set such that $d_1$=2 μm, $d_2$=4 μm, $d_3$=6 μm and $d_4$=8 μm. On the other hand, the row grids 53R have the same width $a_1$ and are disposed with a common, fixed mutual separation such as 2 μm.

By using the exposure mask 31E, too, it is possible to increase the optical dose gradually from the opaque region 33E to the transparent region 32E, similarly to the previous embodiments.

Figure 15A:
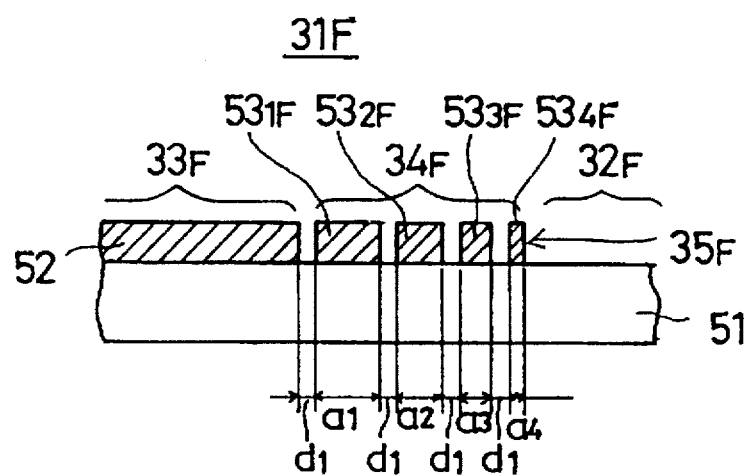
FIGS. 15A–15C are diagrams showing various modifications of the exposure mask of the third embodiment.

FIG. 15A shows an exposure mask 31F according to a modification of the exposure mask 31E, wherein those parts corresponding to the parts described previously are designated by the same reference numerals and the description thereof will be omitted.

Referring to FIG. 15A, the exposure mask 31F carries a mesh-like opaque pattern similar to the exposure mask 31E in correspondence to a transition region 34F defined between an opaque region 33F of the opaque membrane 52 and a transparent region 32F, wherein the opaque pattern includes opaque bands $53_{1F}$, $53_{2F}$, $53_{3F}$ and $53_{4F}$ forming a column grid similarly to the opaque bands $53_{1E}$, $53_{2E}$, $53_{3E}$ and $53_{4E}$ of the mask 31E shown in FIGS. 14A and 14B, wherein the opaque bands $53_{1F}$, $53_{2F}$, $53_{3F}$ and $53_{4F}$ are disposed with a uniform, constant mutual separation $d_1$ and with respective widths $a_1$, $a_2$, $a_3$ and $a_4$, such that the widths $a_1$, $a_2$, $a_3$ and $a_4$ decrease gradually and consecutively ($a_1>a_2>a_3>a_4$). Typically, the separation $d_1$ may be set to 2 μm in the embodiment of FIG. 15A, while the widths $a_1$, $a_2$, $a_3$ and $a_4$ may be set respectively to 8 μm, 6 μm, 4 μm and 2 μm.

Figure 15B:
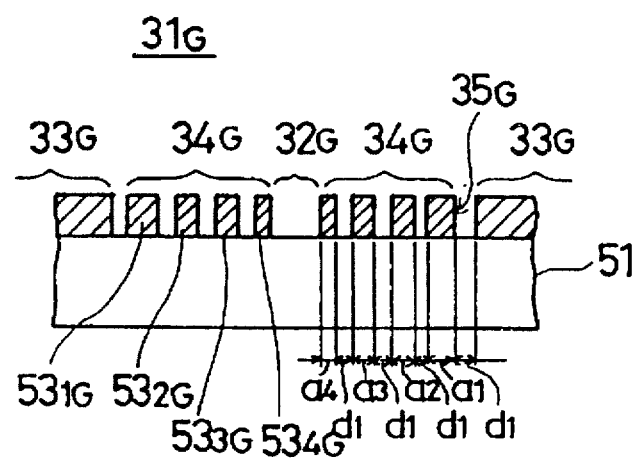

FIG. 15B shows an exposure mask 31G according to another modification of the mask 31E, wherein those parts corresponding to the parts described previously are designated by the same reference numerals and the description thereof will be omitted.

Referring to FIG. 15B, the exposure mask 31G has a concentric construction similar to the exposure mask 31B except that radial bands are formed so as to cross the concentric bands radially. Thus, the mask 31G includes a number of concentric bands $53_{1G}$, $53_{2G}$, $53_{3G}$ and $53_{4G}$ of an opaque material in a circular cutout formed in the opaque membrane 52 now forming an opaque region 33G. Thereby, the concentric bands $53_{1G}$, $53_{2G}$, $53_{3G}$ and $53_{4G}$ form a transition region 34G, and the innermost band $53_{4G}$ defines a transparent region 32G therein. In the transition region 34G, the bands $53_{1G}$, $53_{2G}$, $53_{3G}$ and $53_{4G}$ are disposed with a uniform mutual separation $d_1$ typically set to 2 μm, and the bands $53_{1G}$, $53_{2G}$, $53_{3G}$ and $53_{4G}$ have respective widths $a_1$, $a_2$, $a_3$ and $a_4$ that increase gradually and consecutively from the edge of the opaque region 33G toward the transparent region 32G ($a_1>a_2>a_3>a_4$). Typically, the widths $a_1$, $a_2$, $a_3$ and $a_4$ may be set respectively to 8 μm, 6 μm, 4 μm and 2 μm.

Figure 15C:
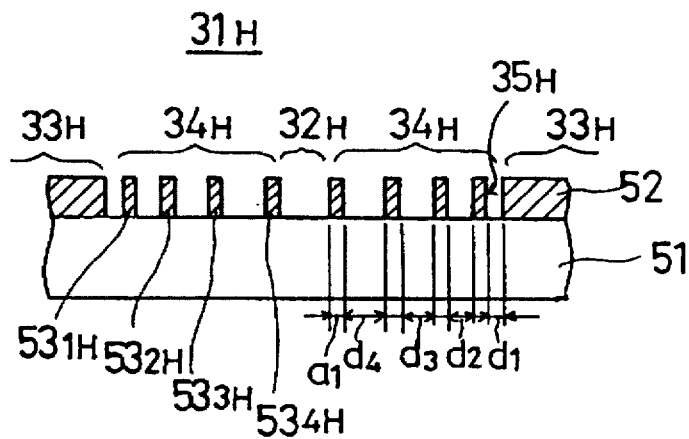

FIG. 15C shows an exposure mask 31H according to a further modification of the mask 31E, wherein those parts corresponding to the parts described previously are designated by the same reference numerals and the description thereof will be omitted.

Referring to FIG. 15C, the exposure mask 31H has a concentric construction similar to the exposure mask 31B except that radial bands are formed so as to cross the concentric bands radially. Thus, the mask 31H includes a number of concentric bands $53_{1H}$, $53_{2H}$, $53_{3H}$ and $53_{4H}$ of an opaque material in a circular cutout formed in the opaque membrane 52 now forming an opaque region 33H. Thereby, the concentric bands $53_{1H}$, $53_{2H}$, $53_{3H}$ and $53_{4H}$ form a transition region 34H, and the innermost band $53_{4H}$ defines a transparent region 32H therein. In the transition region 34H, the bands $53_{1H}$, $53_{2H}$, $53_{3H}$ and $53_{4H}$ are formed with a uniform width $a_1$ typically set to 2 μm, and the bands $53_{1H}$, $53_{2H}$, $53_{3H}$ and $53_{4H}$ are disposed with respective mutual separations $d_1$, $d_2$, $d_3$ and $d_4$ that increase gradually and consecutively from the edge of the opaque region 33H toward the transparent region 32H ($d_1<d_2<d_3<a_4$). Typically, the separations $d_1$, $d_2$, $d_3$ and $d_4$ may be set respectively to 2 μm, 4 μm, 6 μm and 8 μm.

Figure 16A:
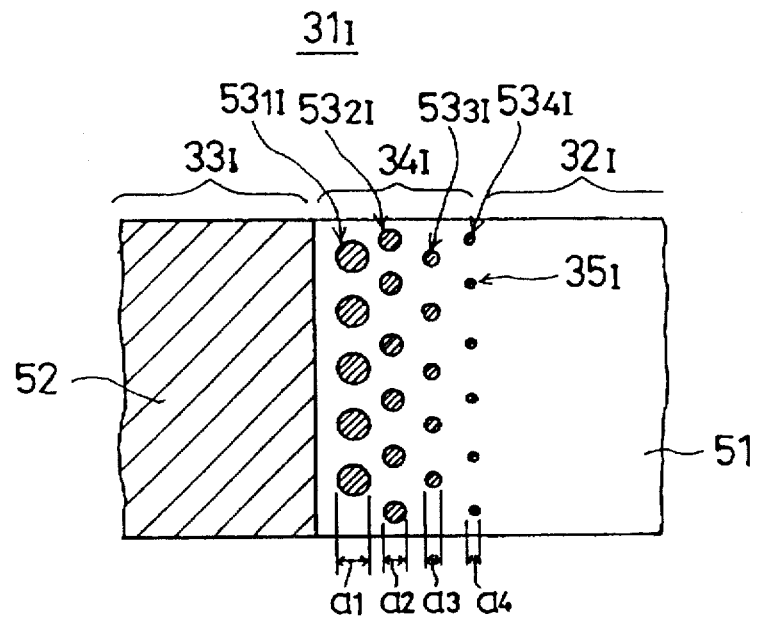
FIGS. 16A and 16B are diagrams showing the construction of an exposure mask according to a fourth embodiment of the present invention.
Figure 16B:
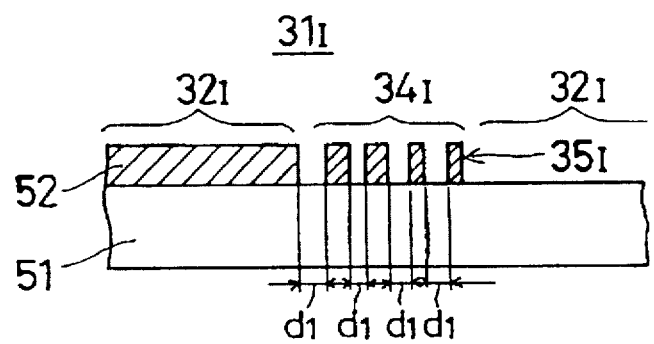

FIGS. 16A and 16B show an exposure mask 31I according to a fourth embodiment of the present invention, wherein FIG. 16A shows the mask 31I in a plan view while FIG. 16B shows the mask 31I in a cross sectional view. In FIGS. 16A and 16B, those parts described previously with reference to preceding embodiments are designated by the same reference numerals and the description thereof will be omitted.

Referring to FIGS. 16A and 16B, the exposure mask 31I is formed on the substrate 51 of a glass slab on which an opaque region 33I and a transparent region 32I are defined, wherein the opaque region 33I is provided by the opaque pattern 52. Further, a transition region 34I is formed between the opaque region 33I and the transparent region 32I, wherein the transition region 34I includes a number of circular patterns $53_{1I}$–$53_{4I}$ of an opaque material having respective diameters $a_1$–$a_4$ and disposed with a uniform mutual separation $d_1$ typically set to 2 µm, well below the resolution limit of the exposure, which is set to 4 µm when the thickness of the photoresist layer to be exposed is 8 µm. Typically, the diameters $a_1$, $a_2$, $a_3$ and $a_4$ may be set to 8 µm, 6 µm, 4 µm and 2 µm, respectively.

According to the construction of the exposure mask 31I, it is possible to increase the exposure dose gradually from the edge of the opaque region 33I to the transparent region 32I, and the exposed pattern is characterized by a sloped boundary as indicated in FIG. 5B or FIG. 8B.

Figure 17A:
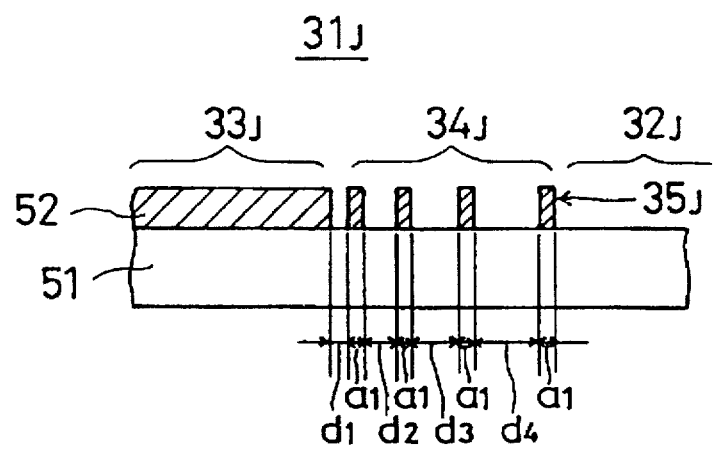
FIGS. 17A–17C are diagrams showing a modification of the exposure mask of the fourth embodiment.

FIG. 17A shows the construction of an exposure mask 31J according to a modification of the exposure mask 31I, wherein those parts described previously are designated by the same reference numerals and the description thereof will be omitted.

In the embodiment of FIG. 17A, the mask 31J includes an opaque region 33J formed of the opaque pattern 52 and a transparent region 32J, with a transition region 34J formed between the opaque region 33J and the transparent region 32J, wherein the transition region 34J includes a number of opaque dots 35J each having a diameter $a_1$ of about 2 µm, which is well below the resolution limit of the exposure. In the embodiment of FIG. 17A, the opaque dots 35J are disposed with variable mutual separations $d_1$, $d_2$, $d_3$ and $d_4$ such that the mutual separation increases from the edge of the opaque region 33J toward the transparent region 32J according to the order of $d_1$, $d_2$, $d_3$ and $d_4$ ($d_1<d_2<d_3<d_4$). Typically, the mutual separations $d_1$, $d_2$, $d_3$ and $d_4$ may be set to 2 µm, 4 µm, 6 µm and 8 µm, respectively.

By using the exposure mask 32J, it is possible to expose a pattern having a sloped edge as indicated in FIG. 5B or FIG. 8B.

Figure 17B:
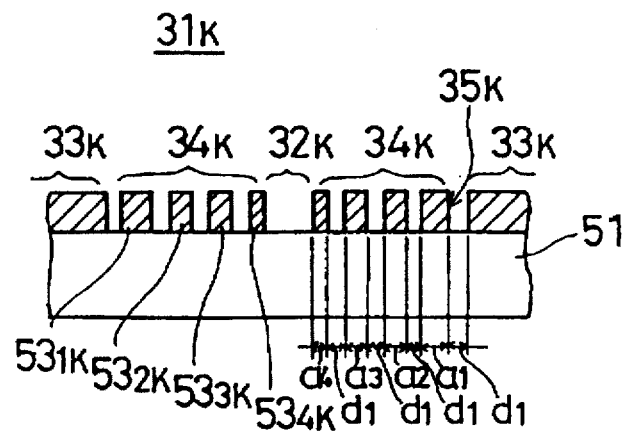

FIG. 17B shows an exposure mask 31K according to another modification of the mask 31I, wherein the mask 31K includes an opaque region 33K formed of the opaque pattern 52. The opaque pattern 52 is formed with a circular cutout exposing the surface of the substrate 51, and a number of opaque dots $53_{1k}$–$53_{4k}$ are disposed in the circular cutout to collectively form a number of concentrically arranged, ring-shaped patterns. Thereby, the dots forming the outermost ring $53_{1k}$ have a common diameter $a_1$, the dots forming the next outermost ring $53_{2k}$ have a common diameter $a_2$, the dots forming the next outermost ring $53_3$ have a common diameter $a_3$, and the dots forming the innermost ring $53_{4k}$ have a common diameter $a_4$, wherein the diameters decrease gradually and consecutively from the outermost ring toward the innermost ring ($a_1>a_2>a_3>a_4$), while the separation between the rings is set constant at $d_1$, which may be 2 µm. Thereby, the innermost ring $53_{4k}$ defines a transparent region 32K. The diameters $a_1$–$a_4$ of the dots may be set as $a_1$=8 µm, $a_2$=6 µm, $a_3$=4 µm and $a_2$=2 µm.

Figure 17C:
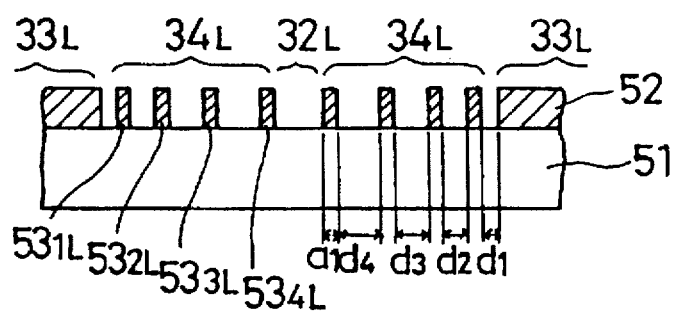

FIG. 17C shows an exposure mask 31L as a modification of the mask 31K, wherein the mask 31L includes opaque dots $53_{1L}$–$53_{4L}$ in the circular cutout of the opaque pattern 52 such that the opaque dots $53_{1L}$–$53_{4L}$ are collectively arranged into a number of concentric rings. In the present embodiment, each of the dots $53_{1L}$–$53_{4L}$ has a common diameter of $a_1$, wherein the rings formed of the dots are disposed with various mutual separations $d_1$–$d_4$, such that the separation between the rings increases from the edge of the opaque region 33L toward the transparent region 32L ($d_1<d_2<d_3<d_4$).

Further, the present invention is by no means limited to the embodiments described heretofore, but various variations and modifications may be made without departing from the scope of the invention.

What is claimed is:

1. An exposure mask comprising:

a mask substrate;

a transparent region defined on said mask substrate;

an opaque region defined on said mask substrate; and a transition region defined on said mask substrate between said transparent region and said opaque region;

said transition region comprising a plurality of opaque patterns having respective sizes and disposed with respective mutual separations, such that said transmission region increases a transmittance gradually from said opaque region to said transparent region.

2. An exposure mask as claimed in claim 1, wherein said plurality of opaque patterns have an elongated stripe shape.

3. An exposure mask as claimed in claim 2, wherein said plurality of opaque patterns are disposed such that said mutual separations increase gradually and consecutively with increasing distance from a boundary between said opaque region and said transition region.

4. An exposure mask as claimed in claim 3, wherein each of said plurality of opaque patterns has a common width.

5. An exposure mask as claimed in claim 2, wherein said plurality of opaque patterns have respective widths that decrease gradually and consecutively with increasing distance from a boundary between said opaque region and said transition region.

6. An exposure mask as claimed in claim 5, wherein said plurality of opaque patterns are disposed with a common mutual separation.

7. An exposure mask as claimed in claim 2, wherein said plurality of opaque patterns extend substantially straight and parallel with each other.

8. An exposure mask as claimed in claim 2, wherein said plurality of opaque patterns form a ring shape and are disposed concentrically on said substrate.

9. An exposure mask as claimed in claim 2, wherein said opaque patterns form a grid.

10. An exposure mask as claimed in claim 1, wherein said plurality of opaque patterns comprise a plurality of opaque dots.

11. An exposure mask as claimed in claim 10, wherein said plurality of opaque dots are disposed such that said mutual separations increase gradually and consecutively with increasing distance from a boundary between said opaque region and said transition region.

12. An exposure mask as claimed in claim 11, wherein each of said plurality of opaque dots has a common diameter.

13. An exposure mask as claimed in claim 10, wherein said plurality of opaque dots have respective diameters that decrease gradually and consecutively with increasing distance from a boundary between said opaque region and said transition region.

14. An exposure mask as claimed in claim 13, wherein said plurality of opaque dots are disposed with a common mutual separation.

15. An exposure mask as claimed in claim 10, wherein said plurality of opaque patterns collectively form a plurality of straight and parallel stripes.

16. An exposure mask as claimed in claim 10, wherein said plurality of opaque patterns collectively form a plurality of rings disposed concentrically on said substrate.

\* \* \* \* \*